United States Patent
Bechtel et al.

(10) Patent No.: US 10,648,632 B2
(45) Date of Patent: May 12, 2020

(54) LIGHT CONVERTING DEVICE WITH TRANSLUCENT LAYER DISPOSED ON A LIGHT CONVERTING LAYER FOR CONVERTING AND SCATTERING LASER LIGHT

(71) Applicant: Lumileds LLC, San Jose, CA (US)

(72) Inventors: Hans-Helmut Bechtel, Roetgen (DE); Ulrich Hechtfischer, Aachen (DE); Thomas Diederich, Stolberg (DE); Matthias Heidemann, Alsdorf (DE); Niels Jeroen Van Der Veen, Geldrop (NL)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/306,310

(22) PCT Filed: May 23, 2017

(86) PCT No.: PCT/EP2017/062396
§ 371 (c)(1),
(2) Date: Nov. 30, 2018

(87) PCT Pub. No.: WO2017/207347
PCT Pub. Date: Dec. 7, 2017

(65) Prior Publication Data
US 2019/0137063 A1   May 9, 2019

(30) Foreign Application Priority Data

Jun. 3, 2016 (EP) ..................................... 16172909

(51) Int. Cl.
*F21S 41/16* (2018.01)
*F21S 41/176* (2018.01)
(Continued)

(52) U.S. Cl.
CPC ............. *F21S 41/16* (2018.01); *F21S 41/176* (2018.01); *F21S 41/24* (2018.01); *H01S 5/005* (2013.01); *F21Y 2109/00* (2016.08)

(58) Field of Classification Search
CPC .......... F21S 41/16; F21S 41/24; F21S 41/176; H01S 5/005
See application file for complete search history.

(56) References Cited

U.S. PATENT DOCUMENTS 8,833,975 B2 *  9/2014  Kishimoto ................ F21K 9/90
                                                          362/294
9,506,626 B2 * 11/2016  Hagemann ......... C09K 11/7774
(Continued)

OTHER PUBLICATIONS

From the International Searching Authority, Notification of Transmittal of the International Search Report and the Written Opinion of the International Searching Authority, Aug. 16, 2017, 14 pages.

*Primary Examiner* — Robert J May

(57) ABSTRACT

A translucent body's first surface is coupled to a top surface of a light converter. The light converter's bottom surface is coupled to a reflective bottom layer. A light coupling structure includes a hole in the reflective bottom layer and at least a slot in the light converter for receiving a light guide, and a light coupling surface for receiving laser light with a laser peak emission wavelength via the light guide. The light coupling surface is arranged so at least 80% of the laser light passing the light coupling surface is received by the translucent body. The translucent body comprises a second surface which is opposite the first surface and is coupled to a reflective top layer for reflecting at least part of the laser light back to the light converter. A peak emission wavelength of the converted light has a longer wavelength than the laser peak emission wavelength.

18 Claims, 6 Drawing Sheets

(51) Int. Cl.
    *H01S 5/00*         (2006.01)
    *F21S 41/24*       (2018.01)
    *F21Y 109/00*     (2016.01)

(56) References Cited

U.S. PATENT DOCUMENTS

| | | | |
|---|---|---|---|
| 9,599,313 B2* | 3/2017 | Woelfing | C09K 11/7774 |
| 10,330,267 B2* | 6/2019 | Annen | F21S 41/141 |
| 2006/0198418 A1 | 9/2006 | Hama et al. | |
| 2010/0172148 A1 | 7/2010 | Komazaki et al. | |
| 2018/0347785 A1* | 12/2018 | Kawaguchi | F21S 2/00 |

* cited by examiner

LIGHT CONVERTING DEVICE WITH TRANSLUCENT LAYER DISPOSED ON A LIGHT CONVERTING LAYER FOR CONVERTING AND SCATTERING LASER LIGHT

FIELD OF THE INVENTION

The invention relates to a light converting device, a laser-based light source comprising such a light converting device, and a vehicle headlight.

BACKGROUND OF THE INVENTION

WO 2010/049875 A1 discloses a wavelength converter which converts laser light of a first wavelength to second light having a different wavelength by means of a wavelength converting material. The surface of the wavelength converting material where the laser light enters the wavelength converting material is in good thermal contact with a transparent material. The transparent material on the other hand is in good thermal contact with a heat sink, which has a window to let the laser light pass before the laser light enters the wavelength converting material. A color point of the light emitted by the wavelength converter may change in a broad range.

SUMMARY OF THE INVENTION

It is an object of the present invention to provide a light converting device with improved color stability. The invention is defined by the independent claims. The dependent claims define advantageous embodiments.

According to a first aspect a light converting device is provided. The light converting device comprises a light converter and a translucent body. A first surface of the translucent body is coupled to a top surface of the light converter. A bottom surface of the light converter is coupled to a reflective bottom layer. The light converting device comprises a light coupling structure. The light coupling structure comprises a hole in the reflective bottom layer and at least a slot in the light converter for receiving a light guide. The light coupling structure comprises a light coupling surface for receiving laser light with a laser peak emission wavelength via the light guide. The light coupling surface is arranged such that at least 80% of the laser light passing the light coupling surface is received by the translucent body. The translucent body comprises a second surface opposite to the first surface. The second surface of the translucent body is coupled to a reflective top layer for reflecting at least a part of the laser light back to the light converter. The light converter is adapted to convert reflected laser light to converted light. A peak emission wavelength of the converted light is in a longer wavelength range than the laser peak emission wavelength. The reflective bottom layer is adapted such that at least 80% of the converted light is emitted via the translucent body and the reflective top layer.

The light coupling structure enables a decoupling of the conversion of the laser light and a transmission of a part of the laser light via the reflective top layer. The intensity of the converted light may be less sensitive to variations of the laser peak emission wavelength of the laser (see FIG. 2 and the corresponding description). Furthermore, a hotspot may be avoided by increasing a surface of the light converter receiving laser light by means of the reflective top layer.

The laser light is preferably in the blue wavelength range. The translucent body may comprise a glass plate, a body made of $Al_2O_3$, Sapphire or any other translucent material or material composition which can withstand the conditions (light intensity, heat etc.) during conversion of the laser light. The reflective top layer may be a dichroic filter which is at least partly reflective in the wavelength range of laser light and essentially transparent in the wavelength range of the converted light. The slot in the light converter may be a cavity with a thin layer of light converting material between the light coupling surface and the translucent body. The layer is very thin such that less than 20%, preferably less than 10% and most preferably less than 5% of the laser light is converted in this layer.

The translucent body may be arranged to cool the light converter. A heat sink may not be needed in this case. Alternatively, a heat sink may be used in addition. This may enable thicker layers of light converting material comprised by the light converter such that more laser light may be converted by means of the light converting material. The translucent body may comprise a translucent material with high thermal conductivity as, for example, Sapphire.

The light coupling structure may comprise a hole through the light converter. The light coupling surface may comprise in this case a surface of the translucent body. The slot in the light converter may end at a surface of the translucent body. The light coupling surface may preferably be a part of the interface between the light converter and the translucent body (a part of the first surface). Alternatively, the light coupling structure may comprise a cavity in the translucent body such that the light coupling surface is not at the same level as the interface between the light converter and the translucent body.

The light converter may be arranged to convert or absorb at least 80%, preferably at least 85%, most preferably at least 90% of the laser light entering the light converter.

The laser peak emission wavelength usually varies for different lasers and further depends on operating temperature and driving current of the laser or lasers. Furthermore, absorption and conversion of the laser light in the light converting material of the light converter depends on the laser peak emission wavelength and may change with temperature. A major part of the back reflected laser light entering the light converter should therefore be converted or absorbed in order to reduce the influence of laser light which is not converted or absorbed within the light converter after entering the light converter. Stability of the color or white point of the light which can be generated by means of light converting device may therefore be increased.

The conversion device may be arranged such that an intensity of the converted light is essentially independent from the laser peak emission wavelength in a predetermined wavelength range of, for example, ±10 nm, preferably ±5 nm around the laser peak emission wavelength (e.g. 450 nm). It may be preferred that essentially all laser light entering the light converter is converted and/or absorbed by the light converting material. Full conversion may, for example, be enabled by the thickness of the light converting material and/or the concentration of the dopant (e.g. Cerium). The reflective bottom layer may, for example, be arranged to enable absorption of laser light at the peak emission wavelengths but arranged to reflect converted light. The reflective bottom layer may, for example, be a dichroic filter reflecting converted light but being transparent for laser light. The light converting device may, for example, further comprise an absorption layer or body coupled to the lower side of the reflective bottom layer opposite to the light converter. The light converting device may further comprise side coatings being arranged to reflect laser light and converted light.

The reflective top layer may be adapted to transmit at least 10% and not more than 50% of the laser light, preferably at least 15% and not more than 45% of the laser light, and more preferably at least 18% and not more than 40% of the laser light received via the light coupling surface.

Transmissivity of the reflective top layer may be used to determine a color point of mixed light which can be generated by means of the light converting device. The mixed light comprises the transmitted laser light and the converted light. A defined transmissivity in combination with nearly full conversion of laser light entering the light converter may enable a stable color point of the mixed light without active feedback as described above.

The light converting device may, for example, be used in an automotive headlight comprising one or more lasers emitting laser light at a laser peak emission wavelength of 450 nm. Around 21% of the blue laser light may be transmitted and the remaining blue laser light is back reflected to the light converter and converted to yellow converted light. The light converter may in this case comprise or consist of a yellow phosphor garnet (e.g. $Y_{(3-0.4)}Gd_{0.4}Al_5O_{12}$:Ce). This enables a ratio of 26% blue laser light and 74% yellow converted light in the mixed light emitted by the headlight by taking into account, for example, Stokes losses in the phosphor.

The translucent body may be arranged to scatter the laser light. The laser light may be scattered such that an emission cone of the laser light is broadened. The exit angle of laser light transferred by means of a light guide is determined by means of the numerical aperture of the light guide. The light guide may comprise more than one numerical aperture if the light guide comprises two or more claddings (e.g. optical fiber with two claddings). Distribution or exit angle of the laser light within the translucent body may be increased by means of scattering. Increasing the exit angle may enable to illuminate essentially the whole surface of the light converter with reflected laser light. Losses caused by the area covered by the light coupling surface may be reduced. Furthermore, the energy density within the light converter may be decreased by distributing the laser light across the whole light converter. Cooling of the light converter e.g. by means of a heat sink may be simpler and conversion efficiency of the light converting material comprised by the light converter may be increased.

The translucent body may, for example, comprise scattering structures like scattering particles. Scattering within the translucent body may be used to mix laser light and converted light in order to enable a nearly constant color point of the mixed light within a predefined solid angle which can be illuminated by means of the laser-based light source comprising the light converting device. Alternatively or in addition, the reflective top layer may be arranged to scatter light or an additional layer or body may be coupled to the outer layer of the reflective top layer away from the translucent body to scatter the mixed light.

The translucent body may comprise a lower translucent layer coupled to the top surface of the light converter and an upper translucent layer coupled to the reflective top layer. A surface of the lower translucent layer pointing away from the light coupling surface may be roughened in order to increase the exit angle of the laser light. Alternatively or in addition, the surface of the upper translucent layer away from the reflective top layer may be roughened in order to increase the exit angle of the laser light. There may be an air gap between the lower and the upper translucent layer. The upper translucent layer may in this case be carried by means of a carrier. Alternatively or in addition, a coupling material may be arranged between the upper and lower layer which can withstand the light and temperature within the light converting device during light conversion.

The translucent body may further comprise a deflection layer arranged between the lower translucent layer and the upper translucent layer. The deflection layer may be arranged to increase the exit angle of the laser light as described above.

The light converting device may comprise an anti-reflection layer arranged between the light converter and the translucent body. The anti-reflection layer may be adapted to suppress reflection of the laser light. The anti-reflection layer may decrease the likelihood that laser light is reflected in the direction of the reflective top layer by means of the interface between the light converter and the translucent body. The anti-reflection layer may increase stability of the color point, and especially the white point of light, which can be generated by means of the light converting device.

The reflective top layer may alternatively be adapted to reflect at least 95% of the laser light, more preferably at least 98% of the laser light and most preferably at least 99.5% of the laser light.

The color point of light which can be emitted by means of the light converting device is in this case mainly or even completely determined by the converted light. Such a light converting device may be used in projection applications to produce primary colors green, amber and red. The light converting device may be especially arranged to convert blue light, especially blue laser light, in the light converter, which fully converts blue light into green, amber or red light. The light converter may in this case comprise a light converting material which can be sintered to dense ceramics to form, for example, a Lumiramic body.

Typical light converting materials for green, yellow, amber and red light use $Ce^{3+}$ or $Eu^{2+}$ ions in a variety of (oxo-) nitride, oxide, or silicate materials.

Examples are:

$(Ca_{1-x-y-z}Sr_xBa_yMg_z)_{1-n}Al_{1-a+b}BaSi_{1-b}O_b$:$M_n$ with $0\leq x,y,z\leq 1$, $0\leq a\leq 1$, $0<b\leq 1$, $0\leq n\leq 1$ and M being a metal, selected out of the group, comprising Ce, Pr, Nd, Sm, Eu, Gd, Tb, Dy, Ho, Er, Tm, Yb, Lu or mixtures thereof as well as a mixture of these materials with additives which may be added during ceramic processing.

Europium(II)-activated oxonitridoaluminosilicate of general formula $EA_{2-z}Si_{5-a}Al_aN_{8-b}O_b$:$Eu_z$ wherein $0<a\leq 4$, $0<b\leq 4$ and $0<z\leq 0.2$; where EA is at least one earth alkaline metal chosen from the group of calcium, barium and strontium.

Europium(II)-activated oxonitridosilicate of general formula $(Sr_{1-a-b-c-d-e-f}Ca_bBa_cMg_dZn_eCe_f)Si_{x-g}Ge_gN_yO_z$:$Eu_a$, wherein $0.001\leq a\leq 0.2$, $0.0\leq b\leq 1$, $0.0\leq c\leq 0.5$, $0.0\leq d\leq 0.25$, $0.0\leq e\leq 0.25$, $0\leq f\leq 0,2$, $0<g<1$, $1.5\leq x\leq 2.5$, $1.5\leq y\leq 2.5$ and $1.5<z<2.5$.

Cerium(III) activated garnet materials.

Other light converting materials or phosphor materials which may be comprised by the light converter are:

| | |
|---|---|
| $(Ba_{1-x}Sr_x)_2SiO_4$:Eu | green |
| $SrGa_2S_4$:Eu | green |
| $SrSi_2N_2O_2$:Eu | green |
| SrS:Eu | red |
| $(Sr_{1-x-y}Ca_xBa_y)_2Si_5N_8$:Eu | red/amber |
| $(Sr_{1-x-y}Ca_xBa_y)_2Si_{5-a}Al_aN_{8-a}O_a$:Eu | red |

| | |
|---|---|
| CaS:Eu | red |
| $(Sr_{1-x}Ca_x)S:Eu$ | red |

The light converting device may comprise an anti-reflection layer arranged between the light converter and the translucent body as described above. The anti-reflection layer may improve color saturation if, for example, the reflective top layer is not fully reflective with respect to the wavelength range of the laser light.

The light converting device may comprise a light absorbing layer coupled to the reflective top layer opposite to the translucent body. The light absorbing layer is adapted to absorb transmitted laser light after passing the reflective top layer. The light absorbing layer is further adapted to transmit at least 90% of the converted light after passing the reflective top layer.

The light absorbing layer may comprise one or more sub layers which are arranged as an absorptive color filter to absorb, for example, the blue laser light in order to prevent desaturation of the emission color which can be emitted by means of the light converting device.

According to a further aspect a laser-based light source is provided. The laser based light source comprises a light converting device as described above, a light guide and a laser. The light guide is coupled to the light coupling structure. A light exit surface of the light guide is arranged such that the laser light emitted by the laser via the light guide is received by the light coupling surface.

The laser-based light source may comprise two, three, four or more lasers (e.g. in the form of an array) emitting, for example blue laser light. The light guide may be, for example, an optical fiber comprising one, two or more claddings. The light guide may penetrate an optional heatsink before penetrating the light converter. It may also penetrate a part of the translucent body.

According to a further aspect a vehicle headlight is provided. The vehicle headlight comprises at least one laser-based light source as described above. The vehicle headlight may comprise two, three, four or more laser-based light sources as described above. The white point of a vehicle headlight, and especially of an automotive headlight used for forward lighting, is preferably characterized by a correlated color temperature (CCT) of 5700 K, or a v' color point of about 0.48. White light areas are defined in standards. E.g. ANSI C78.377 is a standard for chromaticity specified by the American National Standards Institute. Most automotive headlights use the 5700 K range as described above. Alternatively, it may also be possible to use a color temperature of 6000 K such that the share of the blue light increases.

It shall be understood that an inventive laser-based light source may have similar and/or identical embodiments, in particular, as defined in the dependent claims and their combinations as well as in the description provided above.

It shall be understood that a preferred embodiment of the invention can also be any combination of the dependent claims with the respective independent claim. Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings:

FIG. 1 shows a principal sketch of a first laser-based light source

FIG. 2 shows an absorption coefficient of a yellow phosphor garnet

FIG. 3 shows a principal sketch of a second laser-based light source

FIG. 4 shows a principal sketch of a third laser-based light source

FIG. 5 shows a principal sketch of a fourth laser-based light source

FIG. 6 shows a principal sketch of a fifth laser-based light source

In the Figures, like numbers refer to like objects throughout. Objects in the Figures are not necessarily drawn to scale.

DETAILED DESCRIPTION OF EMBODIMENTS

Various embodiments of the invention will now be described by means of the Figures.

Figure 1:
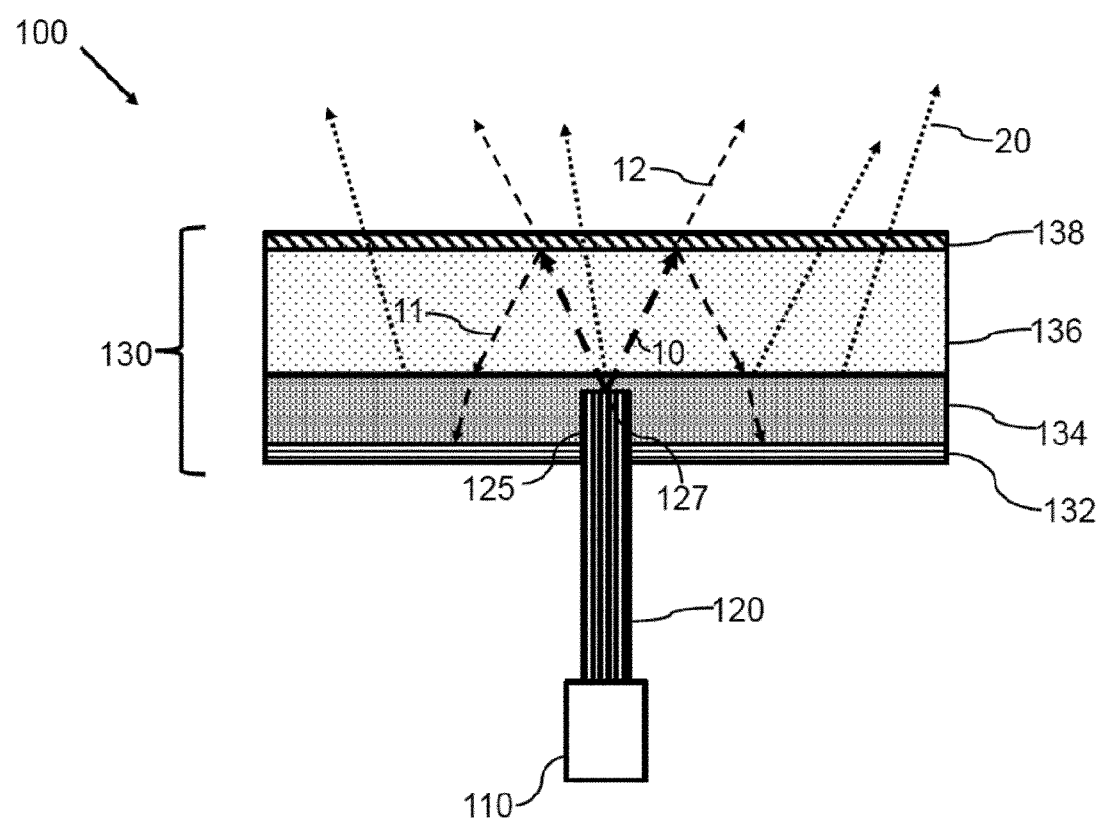

FIG. 1 shows a principal sketch of a first laser-based light source 100 comprising a light converting device 130, a light guide 120 and a laser 100. The light converting device 130 comprises a reflective bottom layer 132 attached to a light converter 134 which is in this case a rectangular block (alternatively a cylindrical body or any other suitable shape may be used) of a yellow phosphor garnet (YAG:Ce). The light converter 134 is attached to a translucent body 136 which consists of sapphire with a high thermal conductivity in order to provide cooling for the light converter 134. On top of the translucent body 136 is a reflective top layer 138 provided. The light guide 120 is coupled to a light coupling structure 125. The light coupling structure 125 comprises a hole in the reflective bottom layer 132 and a slot in the form of a cavity in the light converter 134. A light exit surface of the light guide 120 is arranged such that laser light 10 emitted by the laser 110 via the light guide 120 is received by a light coupling surface 127. The laser light 10 with the wavelength of 450 nm has to pass a thin layer of the light converter 134. The thickness of the layer between the light coupling surface 127 and the translucent body 136 is arranged such that less than 5% of the laser light 10 is converted to converted light 20 in order to limit the influence of changes in the laser peak emission wavelength or temperature of the light converter 134. The remaining 95% of the laser light 10 is emitted in the direction of the reflective top layer via the translucent body 136. 25% of the laser light 10 reaching the reflective top layer 138 passes the reflective top layer (transmitted laser light 12). The rest of the laser light 10 is reflected at the reflective top layer 138 back in the direction of the light converter 134 (reflected laser light 11). The light converter 134 converts essentially all of the reflected laser light 11 to converted light 20. Converted light 20 generated within the yellow phosphor garnet is reflected at the reflective bottom layer 132 in the direction of the reflective top layer 138. The reflective top layer 138 is arranged such that all converted light 20 reaching the reflective top layer 138 can pass the layer. The reflective top layer 138 is in this case a dichroic filter comprising a number of sub layers which are arranged that only part of the laser light 10 but essentially all converted light is transmitted. The laser-based light source 100 therefore emits white light comprising a mixture of transmitted laser light 12 and converted light 20.

The sheet of the light converting material has preferably a thickness between 20 μm and 100 μm. The light guide 120 usually has circular cross-section with a diameter between 50 μm and 100 μm. The thickness of the translucent body 136 is chosen to realize transmitted laser light 12 filling the acceptance cone of optical devices (e.g. one or more lenses, reflectors and the like) which may be coupled with the laser-based light source in a lamp arrangement.

Examples with Typical Numbers

Numerical aperture (NA) of the light guide: 0.22.
Diameter of the light guide 120: 100 μm (this is the diameter of the Cladding layer of a Multimode fiber with 50 μm Core)
Thickness of the translucent body 136: 200 μm
Thickness of the light converter 134 (Lumiramic platelet): 50 μm
Platelet size: 500×500 μm$^2$
Depending on the refractive index of the translucent body (nr) or the medium between the exit surface of the light guide 120 and the dichroic filter, blue light will be distributed over a certain area on the light converter 134.
nr=1:

The ratio of the illuminated area of the light converter 134 without the area of the light guide 120 and the total area including the light guide 120 will be 87% (for 200 μm distance between light coupling surface 127 and reflective top layer 138). This ratio takes into account that essentially no converted light is generated in the layer between the light coupling surface 127 and the translucent body 136 (especially in case the light coupling surface 127 is a surface of the translucent body 136; see FIGS. 3 to 6 below). The bigger the ratio the less light may be lost via the light guide 120. The diameter of the illuminated area would in this case be 280 μm.
For nr=1.5:

The illuminated area of the light converter 134 without the area of the light guide 120 and the total area including the light guide 120 will be 79% (with perfect optical coupling to the light guide). The diameter of the illuminated area would in this case be 219 μm.

Figure 2:
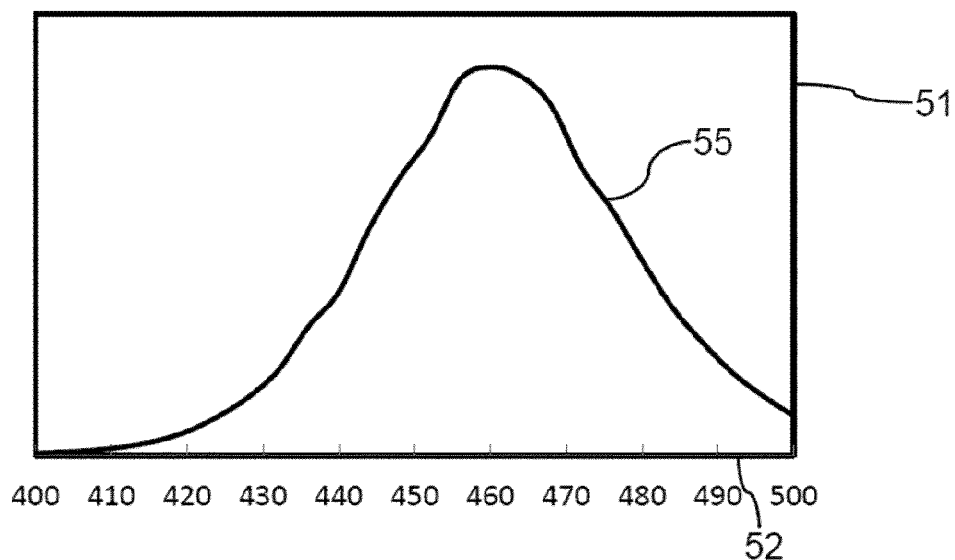

FIG. 2 shows an absorption coefficient 55 of a yellow phosphor garnet. The ordinate 51 shows the absorption coefficient and the abscissa 52 the wavelength. The spectrum of the absorption coefficient across the wavelength shows a typical absorption spectrum of the yellow phosphor garnet $(Y_{(3-0.4)}Gd_{0.4}Al_5O_{12}:Ce)$ as used in today's automotive front lighting applications (automotive headlight). From 440 to 460 nm, which is a typical wavelength range for blue laser (diode) emission, the absorption coefficient increases by more than a factor of 2, which may lead to a large color point shift of the laser-based light source by about 0.067 in CIE 1976 v' color point. The blue laser light 10 needed for the white light is separated from the main part of the laser light 10 which has to be converted prior to the conversion within the light converter 134. The light converting device 130 of the laser-based light source 100 is arranged such that the emission of the converted light 20 is essentially independent of the peak emission or wavelength range of the laser light 10 emitted by e.g. the laser 110 shown in FIG. 1 and FIGS. 3 to 6 below.

Figure 3:
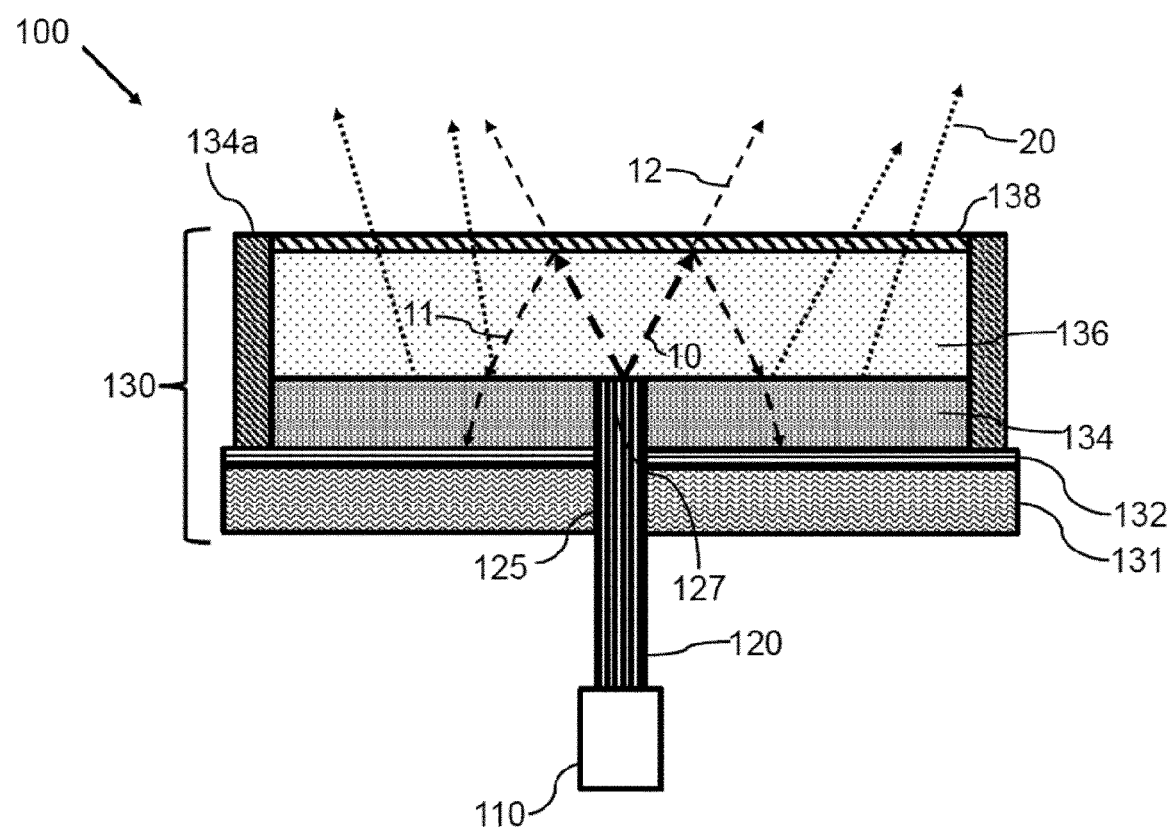

FIG. 3 shows a principal sketch of a second laser-based light source 100. The basic arrangement is the same as described with respect to FIG. 1. The light coupling surface 127 is in this embodiment arranged at the interface between the light converter 134 and the translucent body 136. The laser light 10 directly enters the translucent body 136 without passing any material of the light converter 134. The light converting device 130 further comprises a heat sink 131. A surface of the heat sink 131 is arranged as reflective bottom layer 132 which is glued by means of silicone to the light converter 134. The sides of the light converter 134 essentially perpendicular to the light emission direction and in this case also the translucent body 136 are covered by a side coating 134a which prevents that light can exit through the sides. The combination of the heat sink 131 and the translucent body 136 which comprises glass or alternatively sapphire can be used to cool the light converter 134 more efficient such that a light converter 134 with a thickness of more than 100 μm can be used in order to enable essentially complete light conversion of reflective laser light 11. The additional cooling prevents that the temperature of the Lumiramic light converter 134 increases well above 150° C. and avoids severe thermal quenching. Thermal quenching can easily destroy the light converter 134.

Figure 4:
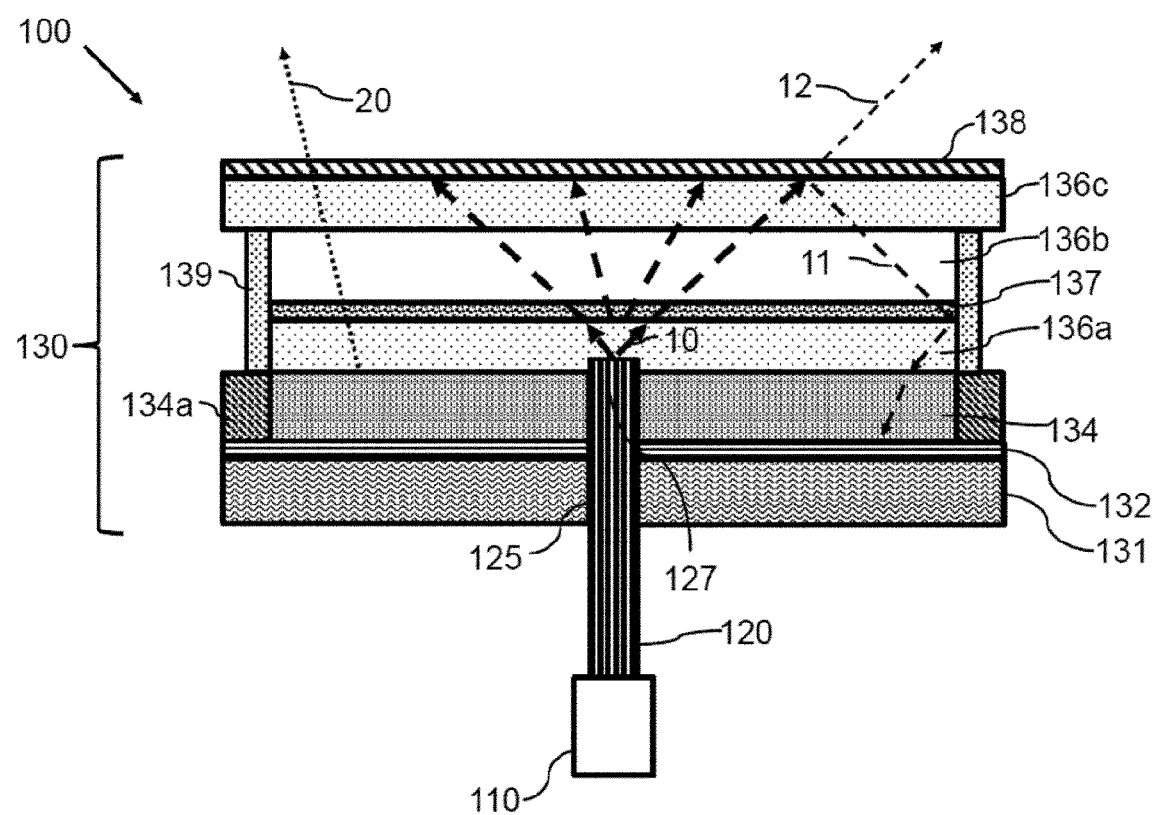

FIG. 4 shows a principal sketch of a third laser-based light source 100. The basic arrangement is the same as described with respect to FIG. 2 with heat sink 131. The light coupling surface 127 is in this embodiment arranged slightly within the translucent body 136 such that the light coupling structure 125 comprises a cavity in the translucent body 136. The translucent body 136 comprises a lower translucent layer 136a made of glass and an upper translucent layer 136c made of glass wherein the lower translucent layer 136a is attached to the light converter 134 and the upper translucent layer 136c is attached to the reflective top layer 138. The upper translucent layer 136c is further attached to a carrier 139 such that a translucent spacing 136b is built between the lower translucent layer 136a and the upper translucent layer 136c. Furthermore, a deflection layer 137 is arranged between the lower translucent layer 136a and the upper translucent layer 136c. The deflection layer 137 is in this case a surface of the lower translucent layer 136a which is structured such that the exit cone of the laser light is broadened by deflecting the laser light 10. The carrier 139 is reflective as well as the side coating 134a of the light converter 134 in order to avoid light losses via the sides of the light converting device 130. The reflective bottom layer 132 is in this case a dichroic filter arranged between the heat sink 131 and the light converter 134 which is reflective for converted light 20 but essentially transparent for reflected laser light 11. Reflected laser light 11 which is not converted in the light converter 134 passes the reflective bottom layer 132 and is absorbed by the heat sink 131.

Figure 5:
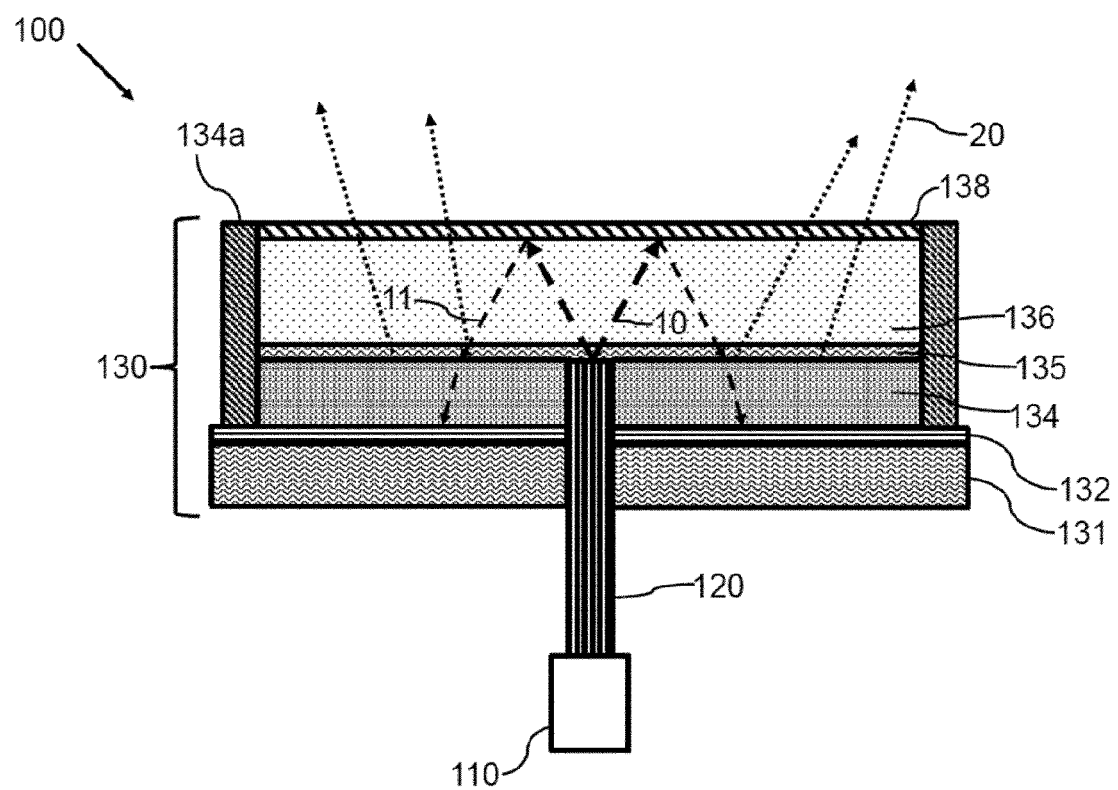

FIG. 5 shows a principal sketch of a fourth laser-based light source 100 which can be used as light source for projection applications. The basic arrangement is very similar to the arrangement described with respect to FIG. 2 with heat sink 131. The reflective top layer 138 reflects at least 99% of the laser light 10 such that essentially only converted light 20 passes the reflective top layer 138. The color point of the light source is therefore determined by means of the wavelength range of the converted light 20. The light converting device 130 further comprises an anti-reflection layer 135 which is arranged between the light converter 134 and the translucent body 136. The anti-reflection layer 135 suppresses reflection of reflective laser light 11 at the interface between the translucent body 136 and the light converter 134.

The examples provided above with typical numbers apply also to the laser-based light source 100 according to FIG. 5 or FIG. 6 below.

Figure 6:
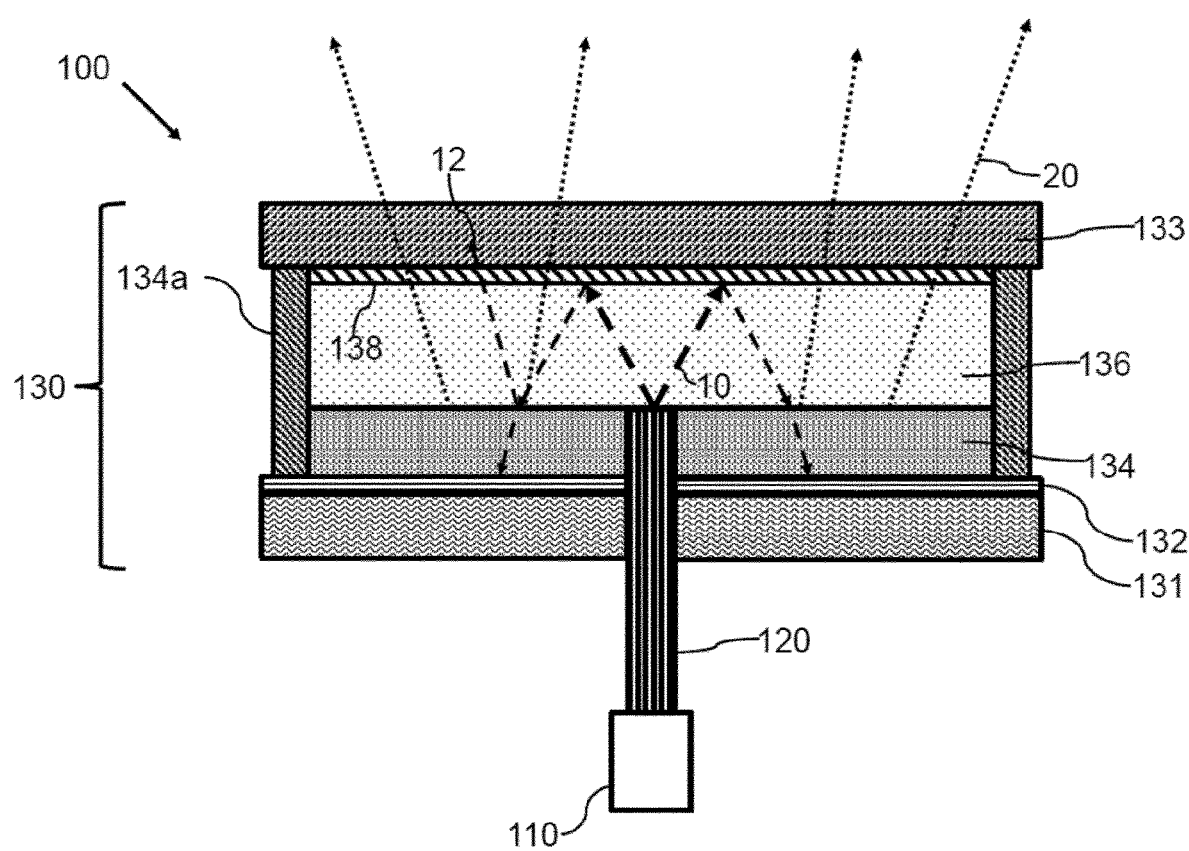

FIG. 6 shows a principal sketch of a fifth laser-based light source 100. The basic arrangement is the same as the arrangement described with respect to FIG. 5 but the light converting device 130 does not comprise an anti-reflection layer 135 between the light converter 134 and the translucent body 136. A light absorbing layer 133 is attached to the upper side of the reflective top layer 138 such that transmitted laser light 12 is absorbed within the light absorbing layer 133 after passing the reflective top layer 138 in order to enable a good color saturation of the converted light 20 emitted by the laser-based light source 100.

The light absorbing layer 133 or color filter layer is chosen according to the intended color emission of the laser-based light source 100. The color filter layers are preferably inorganic pigment materials as:

Blue: $CoO—Al_2O_3$
   Ultramarine
Green: $TiO_2—CoO—NiO—ZrO_2$
   $CeO—Cr_2O_3—TiO_2—Al_2O_3$
   $TiO_2—ZnO—CoO—NiO$
Yellow: Bi-vanadate
   Pr,Z,Si Oxide
   Ti,Sb, Cr Oxide
   Ta Oxidenitride
Red: $Fe_2O_3$
   Zn,Cr,Fe-Oxide
   CdS—CdSe
   Ta ON These materials are preferably used with particle diameters <200 nm, to avoid light losses due to backscattering of light.

Additionally, temperature stable organic pigment can be applied which can be chosen from the group of metal Phthalocyanines or Perylenes.

The position of the light coupling structure 125 and especially the light coupling surface 127 may be adapted to the overall arrangement of the lamp (e.g. vehicle headlight, projection lamp . . . ). It is therefore not necessary that the light converter 120 is arranged in the center of the light converter 134 as shown in FIGS. 1 and 3-6. Furthermore, the light guide 120 and the light converter 134 may enclose an angle different than 90° shown in FIGS. 1 and 3-6.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS 10 laser light
11 reflected laser light
12 transmitted laser light
20 converted light
51 absorption
52 wavelength
55 absorption coefficient of a YAG:Ce Phosphor
100 laser-based light source
110 laser
120 light guide
125 light coupling structure
127 light coupling surface
130 light converting device
131 heat sink
132 reflective bottom layer
133 light absorbing layer
134 light converter
134a side coating
135 anti-reflection layer
136 translucent body
136a lower translucent layer
136b translucent spacing
136c upper translucent layer
137 deflection layer
138 reflective top layer
139 carrier

The invention claimed is:

1. A light converting device comprising a light converter and a translucent body, wherein a first surface of the translucent body is coupled to a top surface of the light converter, wherein a bottom surface of the light converter is coupled to a reflective bottom layer, wherein the light converting device comprises a light coupling structure, wherein the light coupling structure comprises a hole in the reflective bottom layer and a slot in the light converter for receiving a light guide, wherein the light coupling structure comprises a light coupling surface for receiving laser light with a laser peak emission wavelength via the light guide, wherein the light coupling surface is arranged such that at least 80% of the laser light passing the light coupling surface is received by the translucent body, wherein the translucent body comprises a second surface opposite to the first surface, wherein the second surface of the translucent body is coupled to a reflective top layer for reflecting at least a part of the laser light back to the light converter, wherein the light converter is adapted to convert reflected laser light to converted light, wherein a peak emission wavelength of the converted light is in a longer wavelength range than the laser peak emission wavelength, and wherein the reflective bottom layer is adapted such that at least 80% of the converted light is emitted via the translucent body and the reflective top layer.

2. The light converting device according to claim 1, wherein the light coupling structure comprises a hole through the light converter, and wherein the light coupling surface comprises a surface of the translucent body.

3. The light converting device according to claim 1, wherein the light converter is arranged to convert or absorb at least 80% of the laser light entering the light converter.

4. The light converting device according to claim 1, wherein the reflective top layer is adapted to transmit at least 10% and not more than 50% of the laser light received via the light coupling surface.

5. The light converting device according to claim 4, wherein the translucent body is arranged to scatter the laser light.

6. The light converting device according to claim 5, wherein the translucent body comprises a lower translucent layer coupled to the top surface of the light converter and an upper translucent layer coupled to the reflective top layer.

7. The light converting device according to claim 6, wherein the translucent body further comprises a deflection layer arranged between the lower translucent layer and the upper translucent layer.

8. The light converting device according to claim 4, wherein the light converting device comprises an anti-reflection layer arranged between the light converter and the translucent body, wherein the anti-reflection layer is adapted to suppress reflection of the laser light.

9. The light converting device according to claim 1, wherein the reflective top layer is adapted to reflect at least 95% of the laser light.

10. The light converting device according to claim 9, wherein the light converting device comprises a light absorbing layer coupled to the reflective top layer opposite to the translucent body, wherein the light absorbing layer is adapted to absorb transmitted laser light after passing the reflective top layer, and wherein the light absorbing layer is further adapted to transmit at least 90% of the converted light after passing the reflective top layer.

11. The light converting device according to claim 1, wherein the light converter is arranged to convert or absorb at least 85% of the laser light entering the light converter.

12. The light converting device according to claim 1, wherein the light converter is arranged to convert or absorb at least 90% of the laser light entering the light converter.

13. The light converting device according to claim 1, wherein the reflective top layer is adapted to transmit at least 15% and not more than 45% of the laser light received via the light coupling surface.

14. The light converting device according to claim 1, wherein the reflective top layer is adapted to transmit at least 18% and not more than 40% of the laser light received via the light coupling surface.

15. The light converting device according to claim 1, wherein the reflective top layer is adapted to reflect at least 98% of the laser light.

16. The light converting device according to claim 1, wherein the reflective top layer is adapted to reflect at least 99.5% of the laser light.

17. A laser-based light source comprising:
a light converting device a light converter and a translucent body, wherein a first surface of the translucent body is coupled to a top surface of the light converter, wherein a bottom surface of the light converter is coupled to a reflective bottom layer, wherein the light converting device comprises a light coupling structure, wherein the light coupling structure comprises a hole in the reflective bottom layer and a slot in the light converter for receiving a light guide, wherein the light coupling structure comprises a light coupling surface for receiving laser light with a laser peak emission wavelength via the light guide, wherein the light coupling surface is arranged such that at least 80% of the laser light passing the light coupling surface is received by the translucent body, wherein the translucent body comprises a second surface opposite to the first surface, wherein the second surface of the translucent body is coupled to a reflective top layer for reflecting at least a part of the laser light back to the light converter, wherein the light converter is adapted to convert reflected laser light to converted light, wherein a peak emission wavelength of the converted light is in a longer wavelength range than the laser peak emission wavelength, and wherein the reflective bottom layer is adapted such that at least 80% of the converted light is emitted via the translucent body and the reflective top layer;
a light guide; and
a laser, wherein the light guide is coupled to the light coupling structure, wherein a light exit surface of the light guide is arranged such that the laser light emitted by the laser via the light guide is received by the light coupling surface.

18. A vehicle headlight comprising at least one laser-based light source according to claim 17.

* * * * *